United States Patent
Tanaka et al.

(10) Patent No.: US 9,064,721 B2
(45) Date of Patent: Jun. 23, 2015

(54) SEMICONDUCTOR LIGHT EMISSION DEVICE, IMAGE FORMATION APPARATUS AND IMAGE DISPLAY APPARATUS

(71) Applicant: Oki Data Corporation, Tokyo (JP)

(72) Inventors: Shintaro Tanaka, Takasaki (JP); Takahito Suzuki, Takasaki (JP)

(73) Assignee: Oki Data Corporation, Tokyo (JP)

( * ) Notice: Subject to any disclaimer, the term of this patent is extended or adjusted under 35 U.S.C. 154(b) by 0 days.

(21) Appl. No.: 13/686,949

(22) Filed: Nov. 28, 2012

(65) Prior Publication Data

US 2013/0134455 A1 May 30, 2013

(30) Foreign Application Priority Data

Nov. 29, 2011 (JP) ................. 2011-260567

(51) Int. Cl.
| | |
|---|---|
| H01L 29/18 | (2006.01) |
| H01L 25/075 | (2006.01) |
| B41J 2/45 | (2006.01) |
| H01L 23/00 | (2006.01) |
| H01L 33/38 | (2010.01) |
| H01L 33/62 | (2010.01) |

(52) U.S. Cl.
CPC .............. *H01L 25/0753* (2013.01); *B41J 2/45* (2013.01); *H01L 33/38* (2013.01); *H01L 33/62* (2013.01); *H01L 24/18* (2013.01); *H01L 2924/12041* (2013.01)

(58) Field of Classification Search
CPC .......... H01L 27/15; H01L 27/32; H01L 33/00
USPC ........ 257/13, 53, 88, 113, 184, 444, E33.001, 257/E33.067; 438/116
See application file for complete search history.

(56) References Cited

U.S. PATENT DOCUMENTS

| | | | |
|---|---|---|---|
| 2003/0076008 A1* | 4/2003 | Takeuchi et al. .............. 310/328 |
| 2005/0179364 A1* | 8/2005 | Murazaki ....................... 313/498 |
| 2008/0048194 A1* | 2/2008 | Kudo et al. ....................... 257/94 |
| 2009/0135127 A1* | 5/2009 | Lee et al. ........................ 345/102 |
| 2009/0244411 A1* | 10/2009 | Takane et al. ....................... 349/1 |
| 2010/0214200 A1* | 8/2010 | Suzuki et al. .................... 345/82 |
| 2011/0007124 A1* | 1/2011 | Furuta et al. .................... 347/224 |
| 2013/0183496 A1* | 7/2013 | Niki et al. ....................... 428/156 |

FOREIGN PATENT DOCUMENTS

JP 2005-079262 A 3/2005

* cited by examiner

*Primary Examiner* — Jarrett Stark
*Assistant Examiner* — Shahed Ahmed
(74) *Attorney, Agent, or Firm* — Marvin A. Motsenbocker; Mots Law, PLLC

(57) ABSTRACT

A semiconductor light emission device includes a substrate, and semiconductor light emission elements mounted on the substrate and each including an anode connection pad and a cathode connection pad. At least one of the anode connection pad and the cathode connection pad has a fine shaped portion. An image formation apparatus and an image display apparatus are described using the semiconductor light emission device.

13 Claims, 13 Drawing Sheets

SEMICONDUCTOR LIGHT EMISSION DEVICE, IMAGE FORMATION APPARATUS AND IMAGE DISPLAY APPARATUS

CROSS REFERENCE TO RELATED APPLICATIONS

This application claims priority based on 35 USC 119 from prior Japanese Patent Application No. 2011-260567 filed on Nov. 29, 2011, entitled "SEMICONDUCTOR LIGHT EMISSION DEVICE, IMAGE FORMATION APPARATUS AND IMAGE DISPLAY APPARATUS", the entire contents of which are incorporated herein by reference.

BACKGROUND OF THE INVENTION

1. Field of the Invention

This disclosure relates to a semiconductor light emission device having a semiconductor light emission element mounted on a substrate, and relates to an image formation apparatus and an image display apparatus using this semiconductor light emission device.

2. Description of Related Art

There is a print head of an electrophotographic printer that uses an LED array having LEDs arranged in a line. In such a print head (LED array head), an LED array and a drive circuit are connected with each other by wire bonding. Integral formation of the LED array and the drive circuit can reduce the numbers of bonding pads and wires.

As a semiconductor light emission device used for an LED array head, there has recently been proposed a semiconductor light emission device in which a thin-film semiconductor light emission element is fixed by an intermolecular force to a surface of a mount substrate having a wiring portion formed therein in advance. The thin-film semiconductor light emission element and the wiring portion are connected with each other by using thin-film wiring (see Document 1: Japanese Patent Application Publication No. 2005-79262 (see FIG. 2), for example).

In a semiconductor light emission device disclosed in Document 1, a thin-film semiconductor light emission element having a light emission portion and a dedicated electrode (pad) formed therein is fixed by an intermolecular force to a surface of a mount substrate having a wiring portion formed therein. The dedicated electrode of the thin-film semiconductor light emission element is connected to the wiring portion of the mount substrate by using thin-film wiring. Additionally, in order to facilitate the electric connection of the thin-film semiconductor light emission element when mounted in a misaligned position, the dedicated electrode of the thin-film semiconductor light emission element has a larger area than the light emission portion.

SUMMARY OF THE INVENTION

However, the dedicated electrode is a metal, and has a larger thermal expansion coefficient than other parts of the thin-film semiconductor light emission element. For this reason, when the dedicated electrode is formed to have a large area, a stress acts on the thin-film semiconductor light emission element due to thermal contraction in the manufacturing process, and thereby warpage or cracks may occur in the thin-film semiconductor light emission element. In addition, when large warpage occurs in the thin-film semiconductor light emission element, the thin-film semiconductor light emission element peels off from the mount substrate, thereby leading to a reduction in yield.

An object of an embodiment of the invention is to achieve improvement in yield by preventing the occurrence of warpage or cracks in the thin-film semiconductor light emission element.

An aspect of the invention is a semiconductor light emission device including: a substrate; and semiconductor light emission elements mounted on the substrate and each element including an anode connection pad and a cathode connection pad. At least one of the anode connection pad and the cathode connection pad has a fine shaped portion.

This aspect of the invention can achieve improvement in yield by preventing the occurrence of warpage or cracks in the thin-film semiconductor light emission element.

DETAILED DESCRIPTION OF EMBODIMENTS

Figure 1:
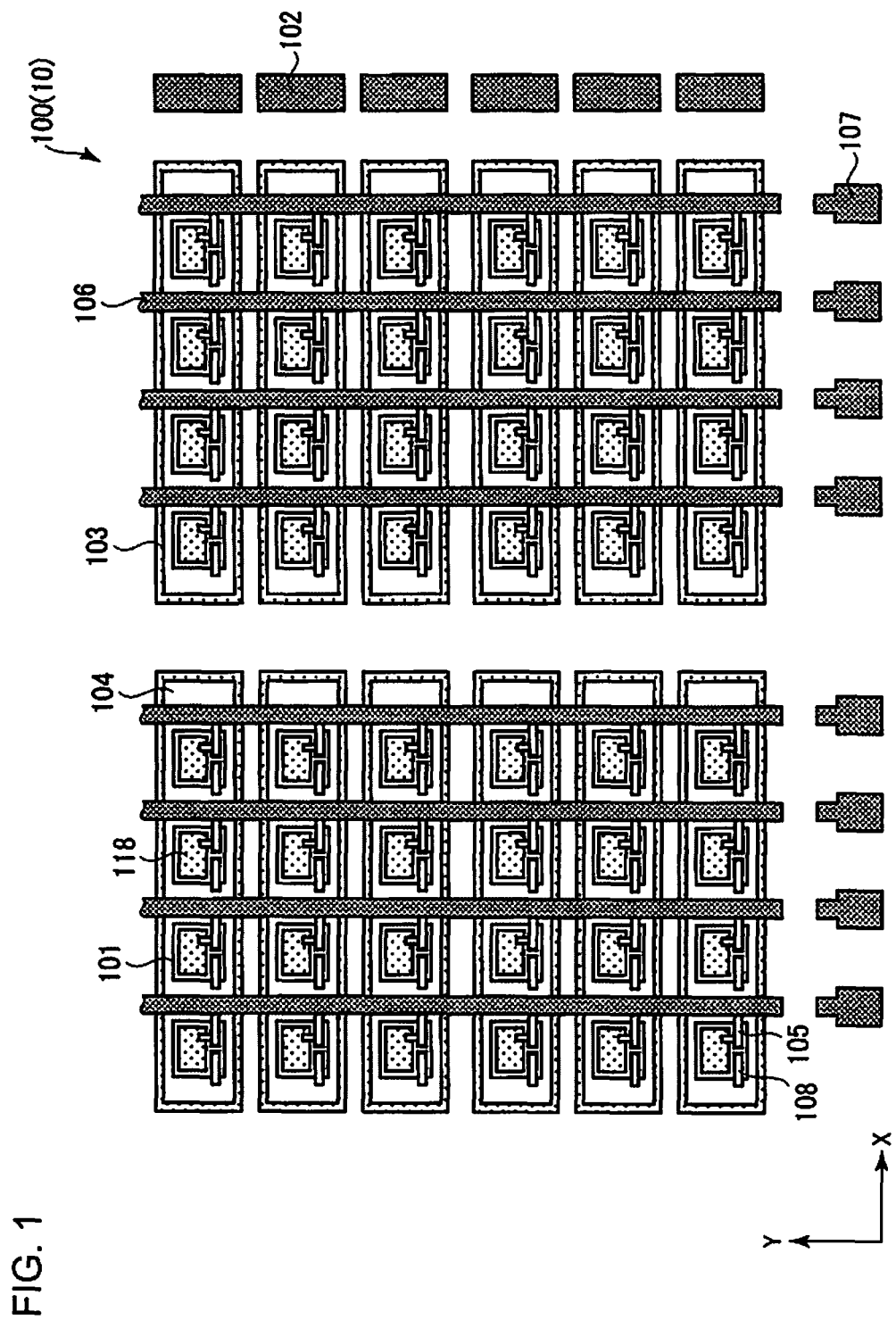
FIG. 1 is a plan view showing a semiconductor light emission device of a first embodiment of the invention.

Descriptions are provided hereinbelow for embodiments based on the drawings. In the respective drawings referenced herein, the same constituents are designated by the same reference numerals and duplicate explanation concerning the same constituents is omitted. All of the drawings are provided to illustrate the respective examples only.

Figure 2:
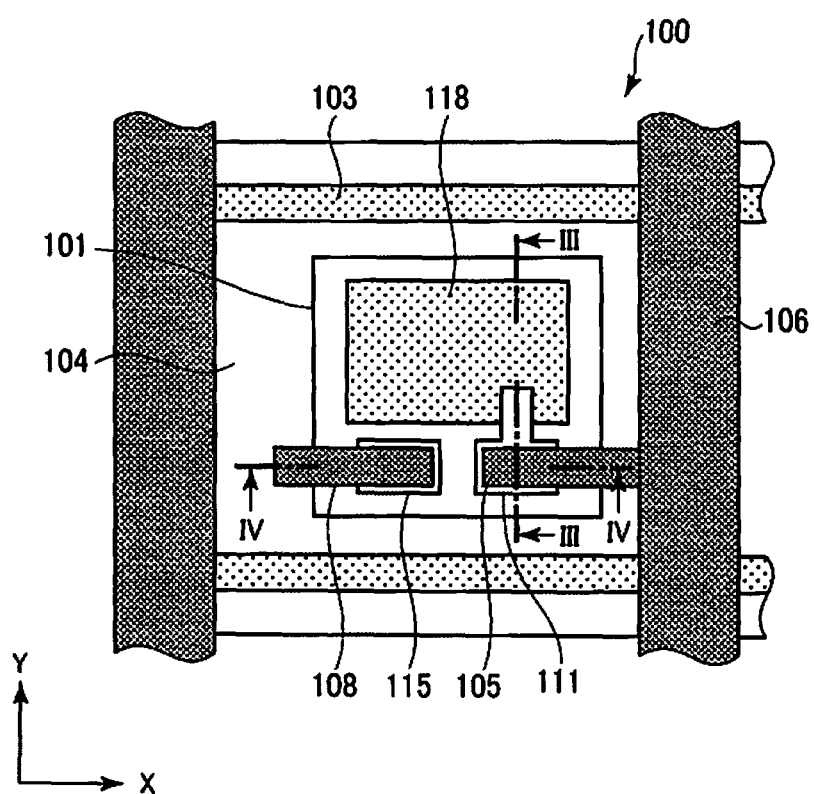
FIG. 2 is an enlarged plan view showing the semiconductor light emission device of the first embodiment.
Figure 3:
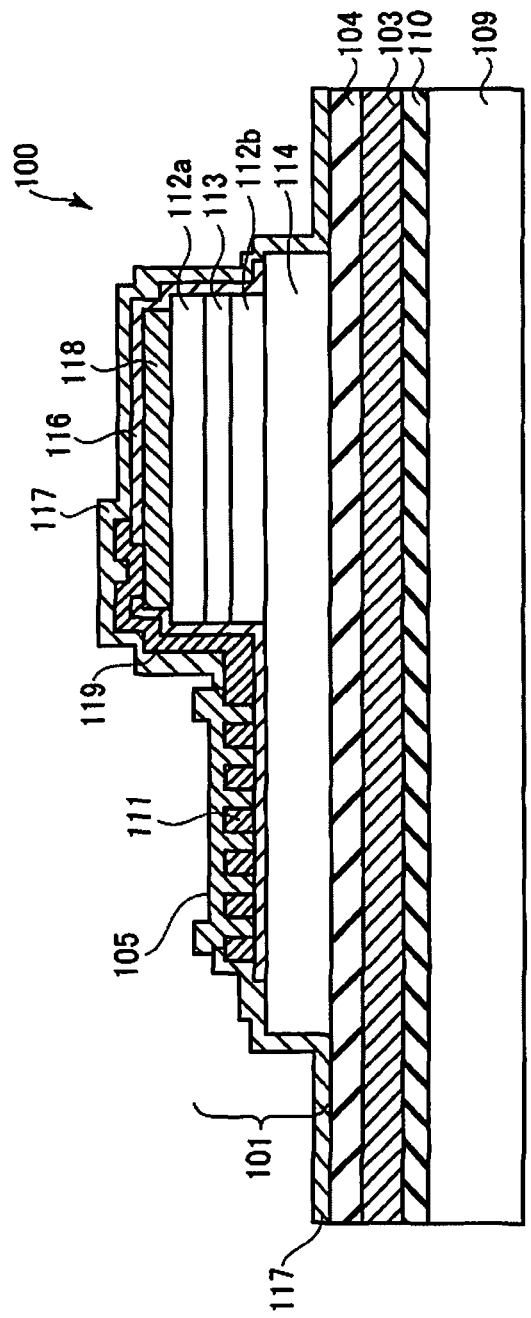
FIG. 3 is a cross-sectional view taken along the line III-III in a direction indicated by arrows shown in FIG. 2.
Figure 4:
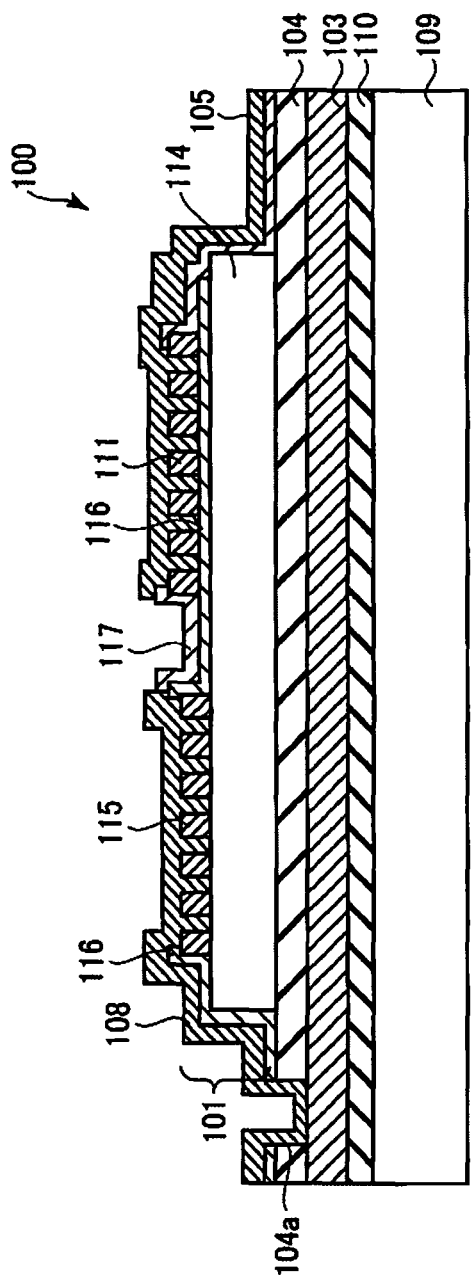
FIG. 4 is a cross-sectional view taken along the line IV-IV in a direction indicated by arrows shown in FIG. 2.
Figure 5:
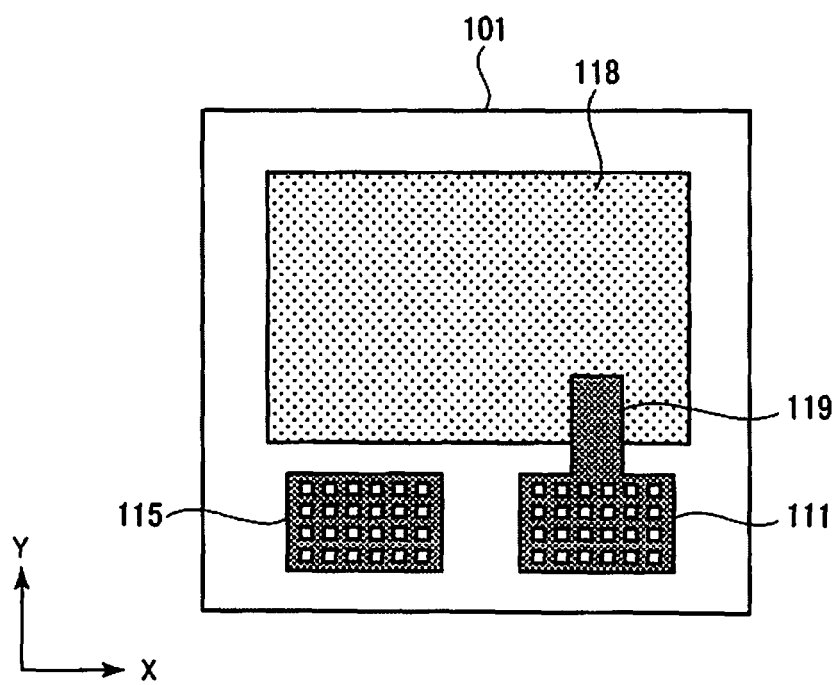
FIG. 5 is a plan view showing a thin-film semiconductor light emission element of the first embodiment.

FIG. 1 is a plan view showing semiconductor light emission device 100 of a first embodiment of the invention. FIG. 2 is an enlarged plan view showing semiconductor light emission device 100 shown in FIG. 1. FIG. 3 is a cross-sectional view taken along the line III-III in a direction indicated by arrows shown in FIG. 2. FIG. 4 is a cross-sectional view taken along the line IV-IV in a direction indicated by arrows shown in FIG. 2. FIG. 5 is a plan view showing thin-film semiconductor light emission element 101 of semiconductor light emission device 100 shown in FIG. 2.

Semiconductor light emission device 100 shown in FIG. 1 forms image display apparatus 10 such as an HUD (head-up display), a portable terminal or a projector, for example. Semiconductor light emission device 100 has thin-film semiconductor light emission elements 101 disposed in a matrix on later-described mount substrate 109 (FIG. 3). Here, a row direction is an X direction, and a column direction is a Y direction.

Thin-film semiconductor light emission elements 101 in each column are connected to anode common wiring 106 in common. Each anode common wiring 106 is connected to anode extraction pad 107. Thin-film semiconductor light emission elements 101 in each row are connected to cathode common wiring 103 in common. Each cathode common wiring 103 is connected to cathode extraction pad 102. Light emission of each of thin-film semiconductor light emission elements 101 is controlled through anode common wiring 106 and cathode common wiring 103, and thus a two-dimensional image can be displayed.

As shown in FIG. 2, thin-film semiconductor light emission element 101 includes anode thin-film wiring 105 connected to anode common wiring 106, and cathode thin-film wiring 108 connected to cathode common wiring 103. Each of anode thin-film wiring 105 and cathode thin-film wiring 108 is formed in a rectangular shape (oblong shape). Note that a connection portion (opening portion 104a) between cathode thin-film wiring 108 and cathode common wiring 103 is shown in FIG. 4 described later.

Anode common wiring 106 and cathode common wiring 103 are formed of Ti/Pt/Au or Ti/Pt/AuGeNi, for example. Note that as for notation of wiring materials, a layer on the left side of the slash is located below a layer on the right side of the slash. In the same manner as anode common wiring 106 and cathode common wiring 103, anode thin-film wiring 105 and cathode thin-film wiring 108 are also formed of Ti/Pt/Au or Ti/Pt/AuGeNi, for example.

As shown in FIG. 3, thin-film semiconductor light emission element 101 includes light emission layer 113, upper and lower two layers of p layers 112a, 112b formed with light emission layer 113 interposed therebetween in an upper and lower direction, anode electrode 118 formed on an upper side of p layer 112a, and n contact layer 114 formed on a lower side of p layer 112b.

Light emission layer 113 is a multiple quantum well (MQW) layer having an InGaN layer and a GaN layer, or is a multiple quantum well layer having an AlGaInP layer, for example. P layers 112a, 112b are formed of p-GaN or p-GaP, for example. N contact layer 114 is formed of n-GaN or n-GaAs, for example. Anode electrode 118 is formed of ITO (indium tin oxide), IZO (indium zinc oxide) or Ni/Au, for example.

A stacked body including light emission layer 113 and p layers 112a, 112b described above is subjected to patterning by later-described etching so as to expose n contact layer 114. In addition, interlayer dielectric film 116 is provided to cover exposed n contact layer 114 and the stacked body (light emission layer 113 and p layers 112a, 112b). Interlayer dielectric film 116 is an inorganic dielectric film such as SiN, SiO$_2$ and Al$_2$O$_3$, or is an organic dielectric film such as a polyimide, an epoxy or an acrylic.

Interlayer dielectric film 116 includes openings (contact holes) at a predetermined spot on anode electrode 118, and at a predetermined spot (FIG. 4) on n contact layer 114.

As shown in FIG. 4, cathode connection pads 115 are formed on n contact layer 114 so as to be located at the opening of interlayer dielectric film 116. Each cathode connection pad 115 is formed of Ti/Al or Ti/Pt/AuGeNi, for example.

Additionally, anode connection pad 111 is formed on interlayer dielectric film 116 formed on n contact layer 114. Anode connection pad 111 is formed of Ti/Al or Ti/Pt/AuGeNi, for example. Anode connection pad 111 and cathode connection pad 115 are formed to have substantially the same height (in other words, are substantially flush with each other).

In addition, connection portion 119 (FIG. 3) is formed from anode connection pad 111 to an upper surface of anode electrode 118. Connection portion 119 is connected to anode electrode 118 through the opening of interlayer dielectric film 116 on anode electrode 118.

As shown in FIG. 5, each of anode connection pad 111 and cathode connection pad 115 has a large area, such as 5 μm×13 μm, for example. This is for the purpose of facilitating electric connection even when misalignment occurs in mounting thin-film semiconductor light emission element 101 onto mount substrate 109. For this reason, when anode connection pad 111 and cathode connection pad 115 are formed in a simple oblong shape (stereotypical shape), a stress may be applied to thin-film semiconductor light emission element 101 due to the later-described thermal contraction.

Accordingly, in the embodiment, anode connection pad 111 and cathode connection pad 115 each have a microstructure portion or a fine shaped portion (finely processed portion). To be more specific, anode connection pad 111 and cathode connection pad 115 each have a mesh shape, i.e. a shape having opening portions (mesh holes) arranged two-dimensionally. With this formation, a stress applied to thin-film semiconductor light emission element 101 is reduced.

Referring back to FIG. 3, mount substrate 109 on which thin-film semiconductor light emission element 101 is to be mounted includes a semiconductor substrate such as Si, GaAs, GaP, InP, GaN and ZnO, a ceramic substrate such as AlN and Al$_2$O$_3$, a glass epoxy substrate, a metal substrate such as Cu and Al, or a plastic substrate, for example.

Dielectric film 110 made of Si or SiO$_2$, for example, is formed on mount substrate 109. Cathode common wiring 103 described above is formed on dielectric film 110. Flattened film 104 which is made of a polyimide or epoxy resin, for example, and which has a surface roughness of 5 nm or less is formed to cover cathode common wiring 103. Thin-film semiconductor light emission element 101 is fixed to a surface of flattened film 104 by an intermolecular force.

Interlayer dielectric film 117 is formed to cover thin-film semiconductor light emission element 101 mounted on mount substrate 109. Interlayer dielectric film 117 is a photosensitive organic dielectric film or an inorganic dielectric film. Note that interlayer dielectric film 117 is omitted in the plan views in FIG. 1 and FIG. 2.

Next, a manufacturing method of semiconductor light emission device 100 is described. First, a sacrifice layer made of AlGaAs, for example, is formed on a growth substrate other than mount substrate 109, and n contact layer 114, p layer 112b, light emission layer 113, p layer 112a and anode electrode 118 are stacked in that order on the sacrifice layer. Then, the stacked body is etched to expose n contact layer 114. Thereafter, interlayer dielectric film 116 is formed to cover the stacked body and exposed n contact layer 114.

Subsequently, interlayer dielectric film 116 is partially removed by photolithography or etching to form openings for connection to anode electrode 118 and n contact layer 114. Moreover, film formation of each of anode connection pad 111 and cathode connection pad 115 is carried out at a predetermined spot on n contact layer 114 by metal vapor deposition or sputtering, and then patterning is performed thereon by lift-off or etching. Anode connection pad 111 and cathode connection pad 115 each have a mesh shape as described above.

Note that, as shown in FIG. 4, cathode connection pad 115 is connected to n contact layer 114 through the opening of interlayer dielectric film 116. On the other hand, anode connection pad 111 is formed on interlayer dielectric film 116 and is not in contact with n contact layer 114. In addition, connection portion 119 (FIG. 3) is formed together with anode connection pad 111, and is connected to anode electrode 118 through the opening of interlayer dielectric film 116.

After an LED (light-emitting diode) structure is formed as described above, the sacrifice layer is removed by etching. Thus, the LED structure is separated from the growth substrate. Note that the sacrifice layer (AlGaAs, for example) is a layer to be selectively removed from the LED structure and the growth substrate by using hydrofluoric acid, for example, as an etchant. The LED structure thus separated from the growth substrate is thin-film semiconductor light emission element 101.

On the other hand, dielectric film 110 is formed on mount substrate 109, then cathode common wiring 103 is formed on dielectric film 110, and flattened film 104 is formed on cathode common wiring 103 in such a way as to have a surface roughness of 5 nm or less.

Then, the LED structure (thin-film semiconductor light emission element 101) separated from the growth substrate is fixed to flattened film 104 on mount substrate 109 by an intermolecular force. Thereby, thin-film semiconductor light emission element 101 is mounted on mount substrate 109.

After thin-film semiconductor light emission element 101 is mounted on mount substrate 109, interlayer dielectric film 117 is formed to cover them. When interlayer dielectric film 117 is a photosensitive organic dielectric film, photolithography is performed. When interlayer dielectric film 117 is an inorganic dielectric film, etching is performed after film formation. Thereby, an opening is formed above each of anode connection pad 111 and cathode connection pad 115.

Thereafter, anode thin-film wiring 105 and cathode thin-film wiring 108 are formed on interlayer dielectric film 117. At this time, anode thin-film wiring 105 is connected to anode connection pad 111 and cathode thin-film wiring 108 is connected to cathode connection pad 115, through the openings formed in interlayer dielectric film 117.

Cathode thin-film wiring 108 is connected to cathode common wiring 103 at opening 104a (FIG. 4) formed in interlayer dielectric film 117 and flattened film 104. In addition, anode common wiring 106 is connected to anode thin-film wiring 105. Anode common wiring 106 and cathode common wiring 103 are respectively connected to anode extraction pad 107 and cathode extraction pad 102, as shown in FIG. 1.

Next, effects of the first embodiment are described in comparison with a comparative example. First, a semiconductor light emission device of the comparative example is described.

Figure 6:
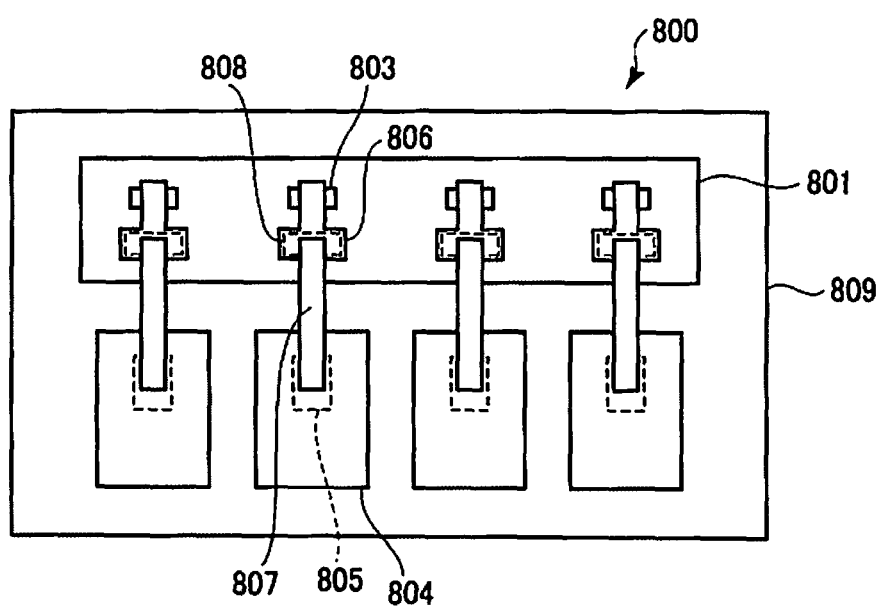
FIG. 6 is a plan view showing a semiconductor light emission device of a comparative example.

FIG. 6 is a plan view showing the semiconductor light emission device of the comparative example. Semiconductor light emission device 800 shown in FIG. 6 is formed by mounting thin-film semiconductor light emission element 801 on mount substrate 809. Light emission portion 803 and anode connection pad 806 are formed in thin-film semiconductor light emission element 801. Note that drawings and descriptions of a cathode connection pad are omitted. Wiring portion 804 including a drive circuit is formed in mount substrate 809.

Thin-film semiconductor light emission element 801 and mount substrate 809 are covered with an unillustrated interlayer dielectric film. Openings 805, 808 corresponding respectively to wiring portion 804 and anode connection pad 806 are formed in the interlayer dielectric film. In addition, thin-film wiring 807 electrically connecting anode connection pad 806 and wiring portion 804 to each other is formed on the interlayer dielectric film.

Anode connection pad 806 is made of a metal, and has a simple oblong shape which is larger in area than light emission portion 803. For this reason, when a temperature change occurs in the manufacturing process of thin-film semiconductor light emission element 801, anode connection pad 806 thermally contracts more than other parts of thin-film semiconductor light emission element 801. Accordingly, a stress acts on thin-film semiconductor light emission element 801 in an in-plane direction, and thereby cracks or warpage may occur in thin-film semiconductor light emission element 801. In addition, when warpage of thin-film semiconductor light emission element 801 is large, thin-film semiconductor light emission element 801 may peel off from mount substrate 809 in mounting thin-film semiconductor light emission element 801 onto mount substrate 809.

On the other hand, in the first embodiment (FIGS. 1 to 5) as described above, since anode connection pad 111 and cathode connection pad 115 each have a mesh shape, thermal contraction can be suppressed as compared with the case where each connection pad has a simple oblong shape. For this reason, the occurrence of cracks or warpage in thin-film semiconductor light emission element 101 can be suppressed. Accordingly, thin-film semiconductor light emission element 101 can be prevented from peeling off from mount substrate 109.

As described above, in the first embodiment of the invention, since anode connection pad 111 and cathode connection pad 115 of thin-film semiconductor light emission element 101 each have a fine shaped portion or a maze shaped portion (mesh shape in the first embodiment), a stress applied to thin-film semiconductor light emission element 101 along with thermal contraction of each connection pad 111, 115 is reduced. As a result, the occurrence of cracks or warpage in thin-film semiconductor light emission element 101 is prevented, and thus thin-film semiconductor light emission element 101 can be prevented from peeling off from mount substrate 109.

Additionally, each connection pad 111, 115 has a large area as a whole. For this reason, even when misalignment occurs in mounting thin-film semiconductor light emission element 101 onto mount substrate 109, connection pads 111, 115 can be electrically connected respectively to common wirings 106, 103 easily.

In addition, each connection pad 111, 115 has a mesh shape, and has a continuous metal layer (parts other than the mesh holes). For this reason, conduction is secured all over the connection pad, and the functions of the connection pads can be fully carried out.

Note here that although a description is given of the case where both anode connection pad 111 and cathode connection pad 115 each have a fine shaped portion (mesh shape in the first embodiment), only one of them may have a fine shaped portion.

Second Embodiment

Figure 7:
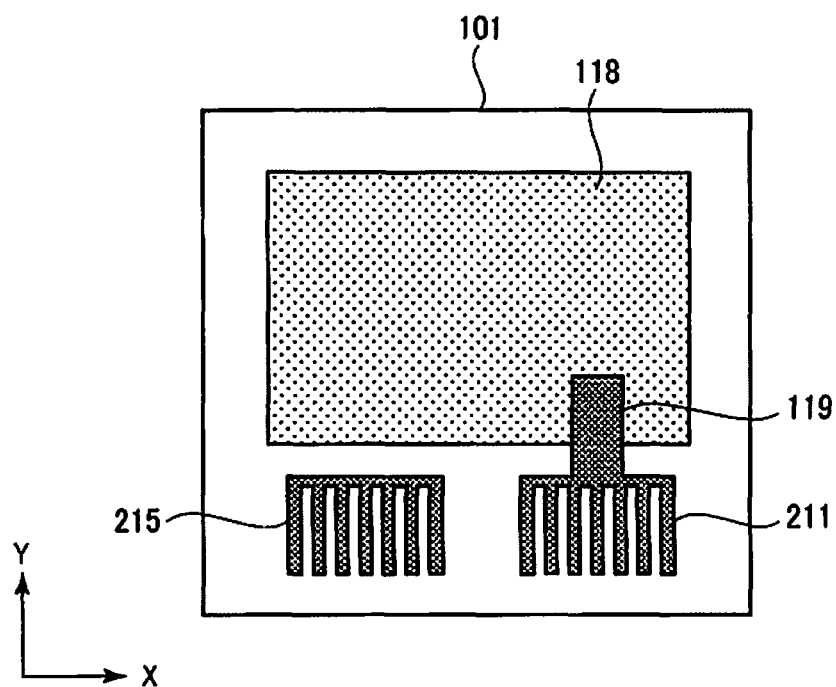
FIG. 7 is a plan view showing a thin-film semiconductor light emission element of a second embodiment of the invention.

FIG. 7 is a plan view showing thin-film semiconductor light emission element 101 of a second embodiment of the invention. The same components as those of the first embodiment are denoted by the same reference numerals. In the second embodiment, configurations of anode connection pad 211 and cathode connection pad 215 are different from those in the first embodiment.

Anode connection pad 111 and cathode connection pad 115 of the first embodiment as described above each have a mesh shape. In contrast, anode connection pad 211 and cathode connection pad 215 of the second embodiment each have a striped pattern shape.

In other words, in each of anode connection pad 111 and cathode connection pad 115 of the first embodiment, openings through which a front surface and a back surface of the pad communicate with each other are each formed in a substantially square shape and disposed in a matrix, whereas, in anode connection pad 211 and cathode connection pad 215 of the second embodiment, openings through which a front surface and a back surface of the pad communicate with each other are each formed in a rectangular shape long in a Y direction and arranged in a direction (X direction) perpendicular to the Y direction.

To be specific, anode connection pad 211 has a shape in which slits long in the Y direction and opened to an external edge (side surface) of anode connection pad 211 are arranged in the X direction. In other words, anode connection pad 211 has a shape in which elongated portions long in the Y direction are arranged in parallel, and one end (here, an end portion on the anode electrode 118 side) in the Y direction of each elongated portion is connected to another. Cathode connection pad 215 also has a similar shape to that of anode connection pad 211.

Each of anode connection pad 211 and cathode connection pad 215 is formed in the following manner. Film formation is carried out by metal vapor deposition or sputtering, and then patterning is performed thereon by lift-off or etching, as in the first embodiment.

In the second embodiment, anode connection pad 211 and cathode connection pad 215 each have a striped pattern shape. For this reason, as compared with a stereotypical shape as in the comparative example (FIG. 6), thermal contraction occurring along with a temperature change can be suppressed and thus a stress applied to thin-film semiconductor light emission element 101 can be reduced. Accordingly, cracks or warpage of thin-film semiconductor light emission element 101 can be suppressed, and thus thin-film semiconductor light emission element 101 can be prevented from peeling off from mount substrate 109.

Additionally, in the second embodiment, each connection pad 211, 215 has a shape in which slits extend to an external edge of each connection pad 211, 215. In other words, regions (portions of slits) where no metal layer exists are not closed by the metal layer. For this reason, the resist is not isolated in patterning each connection pad 211, 215, and hence formation of each connection pad 211, 215 by lift-off is easy.

As described above, in the second embodiment of the invention, anode connection pad 211 and cathode connection pad 215 of thin-film semiconductor light emission element 101 each have a striped pattern shape. For this reason, a stress applied to thin-film semiconductor light emission element 101 along with thermal contraction of each connection pad 211, 215 is reduced. As a result, it is possible to prevent the occurrence of cracks in thin-film semiconductor light emission element 101, and to prevent thin-film semiconductor light emission element 101 from peeling off from mount substrate 109.

In addition, each connection pad 211, 215 has a large area as a whole. For this reason, even when misalignment occurs in mounting thin-film semiconductor light emission element 101 onto mount substrate 109, connection pads 211, 215 can be electrically connected respectively to common wirings 106, 103 easily.

Moreover, in each connection pad 211, 215, regions where no metal layer exists are not closed by the metal layer. For this reason, formation of each connection pad 211, 215 by lift-off is easy. Accordingly, each connection pad 211, 215 can be formed by using Au, Pt or the like (by lift-off) on which patterning is difficult to perform by etching.

Modified Examples

In the second embodiment, although the connection pad with a vertically striped pattern shown in FIG. 7 is described, modifications shown in FIG. 8 and FIGS. 9A, 9B, and 9C may be made.

Figure 8:
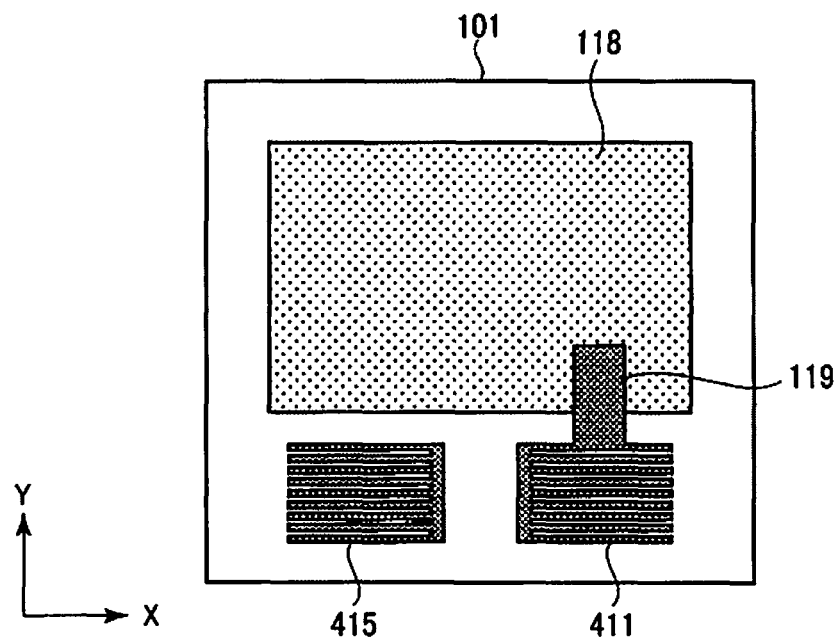
FIG. 8 is a plan view showing a thin-film semiconductor light emission element of a modified example of the second embodiment.

In the modified example shown in FIG. 8, each of anode connection pad 411 and cathode connection pad 415 has a striped pattern shape in which elongated portions long in the X direction are arranged in the Y direction. In other words, each of anode connection pad 411 and cathode connection pad 415 has a shape in which slits long in the X direction and opened to an external edge (side surface) thereof are arranged in the Y direction.

Figure 9A:
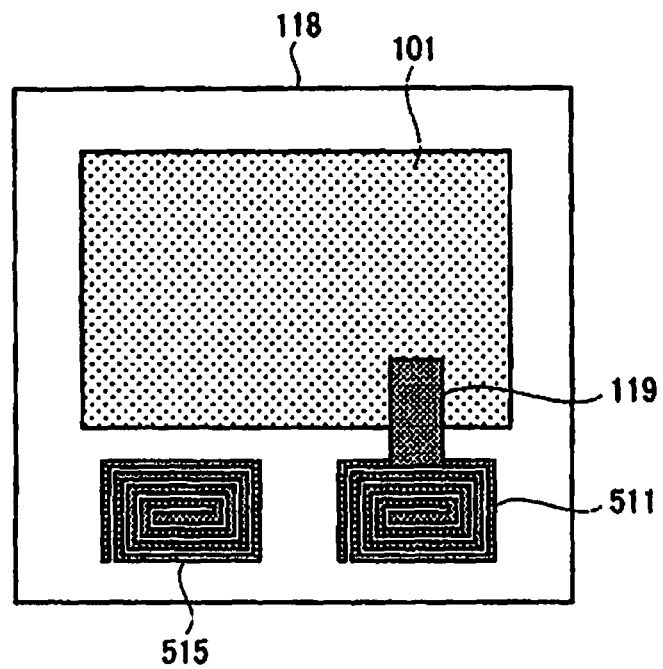
FIG. 9A is a plan view showing a thin-film semiconductor light emission element of another modified example of the second embodiment.

Moreover, in the modified example shown in FIG. 9A, each of anode connection pad 511 and cathode connection pad 515 is formed in a rectangular spiral shape. In other words, in each of anode connection pad 511 and cathode connection pad 515, a slit opened to an external edge (side surface) extends to form a rectangular spiral shape.

Figures 9B, 9C:
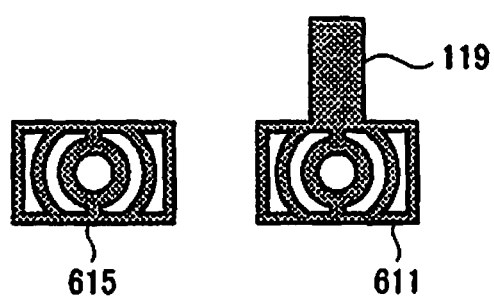
FIG. 9B is a plan view showing an anode connection pad of anther modified example of the second embodiment.
FIG. 9C is a plan view showing a cathode connection pad of anther modified example of the second embodiment.

Furthermore, in the modified examples shown in FIG. 9B and FIG. 9C, each of anode connection pad 611 and cathode connection pad 615 is formed in a diffraction pattern.

In these modified examples as well, a stress applied to thin-film semiconductor light emission element 101 along with thermal contraction of each connection pad 411, 415, 511, 515, 611, 615 is reduced. Accordingly, it is possible to prevent the occurrence of cracks or warpage in thin-film semiconductor light emission element 101, and to prevent thin-film semiconductor light emission element 101 from peeling off from mount substrate 109.

Additionally, in each connection pad 411, 415, 511, 515 shown in FIG. 8 and FIG. 9A, since each slit is opened to an external edge (side surface) thereof, formation of each connection pad 411, 415, 511, 515 by lift-off is easy, as in the second embodiment described above.

Third Embodiment

Figure 10:
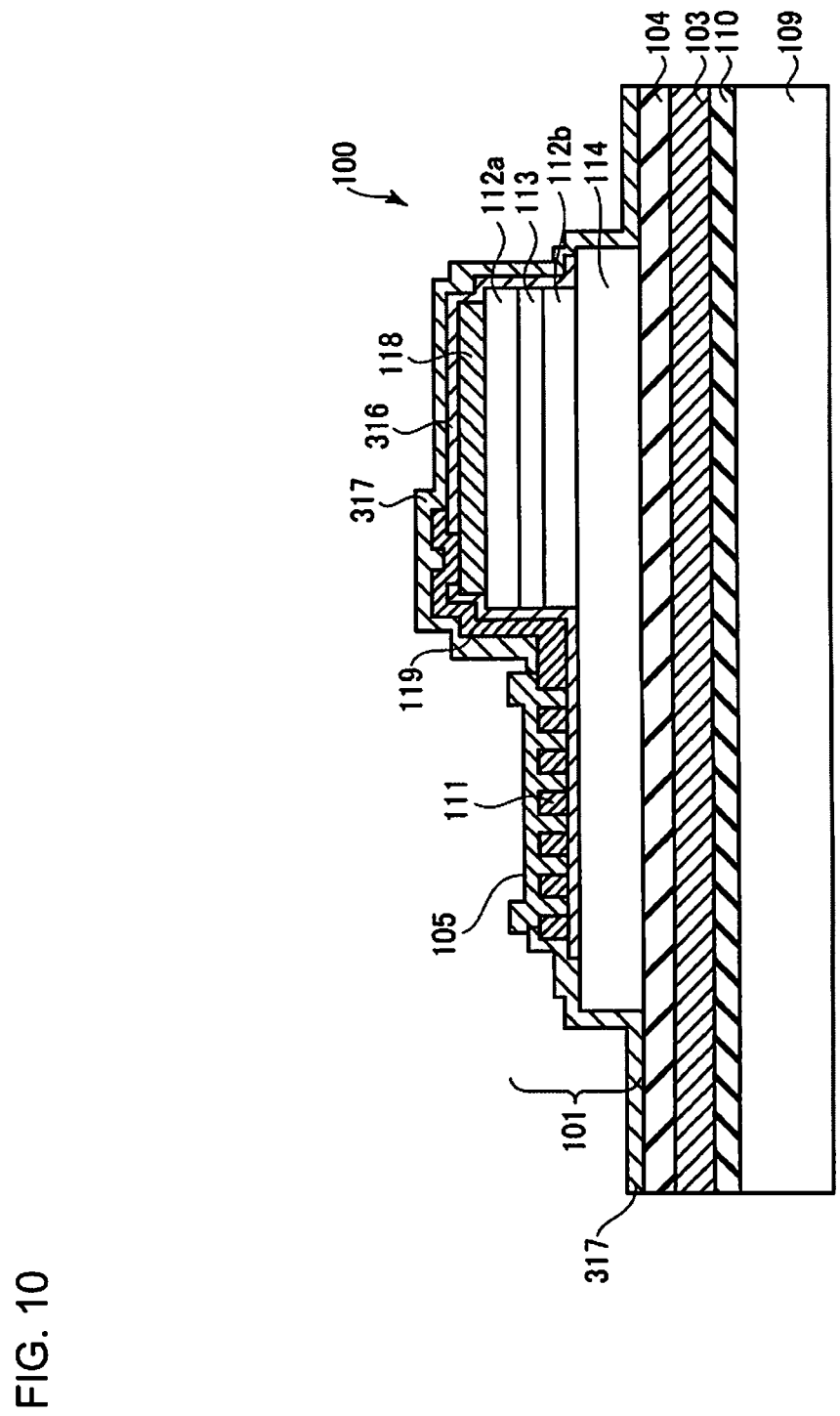
FIG. 10 shows a semiconductor light emission device of a third embodiment of the invention, and is a cross-sectional view taken along the line III-III in a direction indicated by arrows shown in FIG. 2.
Figure 11:
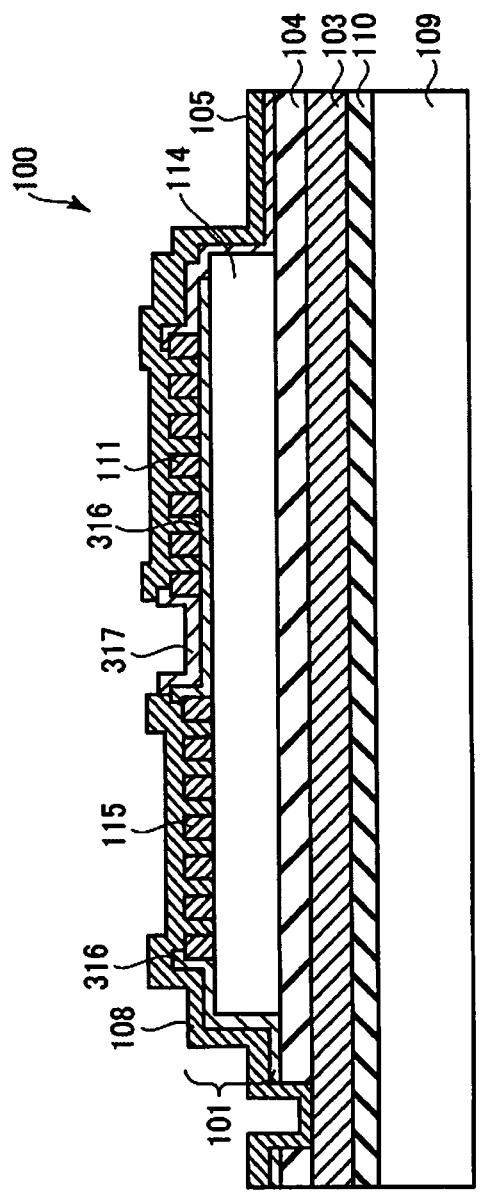
FIG. 11 shows the semiconductor light emission device of the third embodiment, and is a cross-sectional view taken along the line IV-IV in a direction indicated by arrows shown in FIG. 2.

FIG. 10 and FIG. 11 are cross-sectional views showing semiconductor light emission device 100 of a third embodiment of the invention. FIG. 10 corresponds to a cross-sectional view taken along the line III-III in a direction indicated by arrows shown in FIG. 2. FIG. 11 corresponds to a cross-sectional view taken along the line IV-IV in a direction indicated by arrows shown in FIG. 2. The same components as those of the first or second embodiment are denoted by the same reference numerals.

In the embodiment, interlayer dielectric film 316 formed on n contact layer 114 and interlayer dielectric film 317 formed on thin-film semiconductor light emission element 100 are formed of materials having etch selectivity therebetween. Each interlayer dielectric film 316, 317 is made of an inorganic dielectric film such as SiN, $SiO_2$ or $Al_2O_3$, or is an organic dielectric film such as a polyimide, an epoxy or an acrylic. Preferred examples of combinations of interlayer dielectric films 316, 317 having etch selectivity therebetween include a combination of $Al_2O_3$ and SiN, a combination of $Al_2O_3$ and $SiO_2$, a combination of SiN and polyimide, and the like.

$Al_2O_3$ can be patterned by hot phosphoric acid or the like, and has a resistance to $CF_4$ dry etching. Moreover, SiN and $SiO_2$ can be patterned by $CF_4$ dry etching, and have a resistance to hot phosphoric acid. Furthermore, polyimide can be patterned by photolithography, and has a resistance to hot phosphoric acid and $CF_4$ dry etching.

As described above, interlayer dielectric films 316, 317 are formed by a combination of two types of interlayer dielectric films having etch selectivity therebetween. For this reason, when interlayer dielectric film 317 is formed and patterned after thin-film semiconductor light emission element 101 is mounted on mount substrate 109, interlayer dielectric film 316 which has already been formed is not etched. Accordingly, in the formation of anode thin-film wiring 105, n contact layer 119 below anode connection pad 111 is not exposed and thus a short circuit can be prevented.

Note that in the third embodiment, shapes of anode connection pad 111 and cathode connection pad 115 may be any shapes described in the first and second embodiments or modified examples thereof.

As described above, in the third embodiment of the invention, interlayer dielectric films 316, 317 are formed by a combination of interlayer dielectric films having etch selectivity therebetween. Accordingly, when one interlayer dielectric film is etched, the other interlayer dielectric film is prevented from being etched, in addition to the effects described in the first and second embodiments. For this reason, a short circuit between anode thin-film wiring 105 and n contact layer 114 can be prevented, for example.

Semiconductor light emission device 100 using thin-film semiconductor light emission element 101 of the embodiments as described above can be employed in an HUD (head-up display), a portable terminal, a projector or the like as a two-dimensional array light source, for example. Thus, it is possible to reduce power consumption, and to achieve an image display with high luminance and high definition.

Additionally, semiconductor light emission device 100 using thin-film semiconductor light emission element 101 of the embodiments as described above can be employed in an image display apparatus such as an HMD (head mount display) or in an image formation apparatus such as an electrophotographic printer, as a one-dimensional array light source, for example.

Next, a description is given of a configuration example of an image formation apparatus employing semiconductor light emission device 100 using thin-film semiconductor light emission element 101 of the embodiments.

Figure 12:
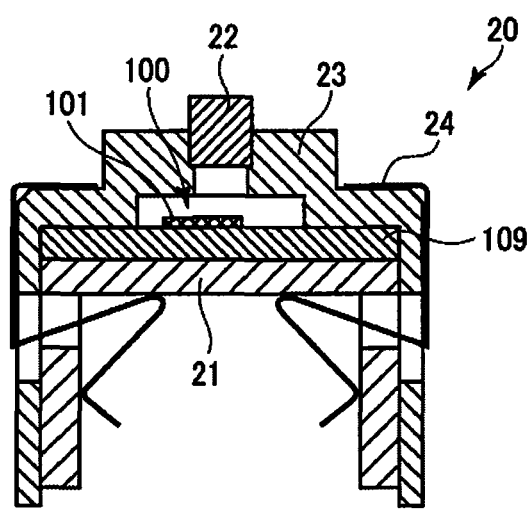
FIG. 12 is a cross-sectional view showing a print head using the semiconductor light emission device of the first, second or third embodiment.

FIG. 12 is a cross-sectional view showing an example in which semiconductor light emission device 100 of the above-described first, second or third embodiment is employed in print head 20 of an image formation apparatus.

Print head (LED array head) 20 shown in FIG. 12 is a print head in which semiconductor light emission device 100 of the first, second or third embodiment is mounted on base member 21. Thin-film semiconductor light emission elements 101 of semiconductor light emission device 100 are arranged one-dimensionally (may be arranged in the row direction X or in the column direction Y shown in FIG. 1).

Rod lens array 22 serving as an optical element configured to collect light emitted from thin-film semiconductor light emission element 101 is placed above semiconductor light emission device 100. Rod lens array 22 is a rod lens array in which optical lens elements are arranged in an arrangement direction of thin-film semiconductor light emission elements 101, and is held at a predetermined position by lens holder 23 serving as an optical element holder.

Lens holder 23 is formed to cover base member 21 and semiconductor light emission device 100. Base member 21, semiconductor light emission device 100 and lens holder 23 are integrally held by clamper 24.

Light emitted from semiconductor light emission device 100 is applied to a surface of later-described photosensitive drum 41 through rod lens array 22, and is used to form an electrostatic latent image.

Figure 13:
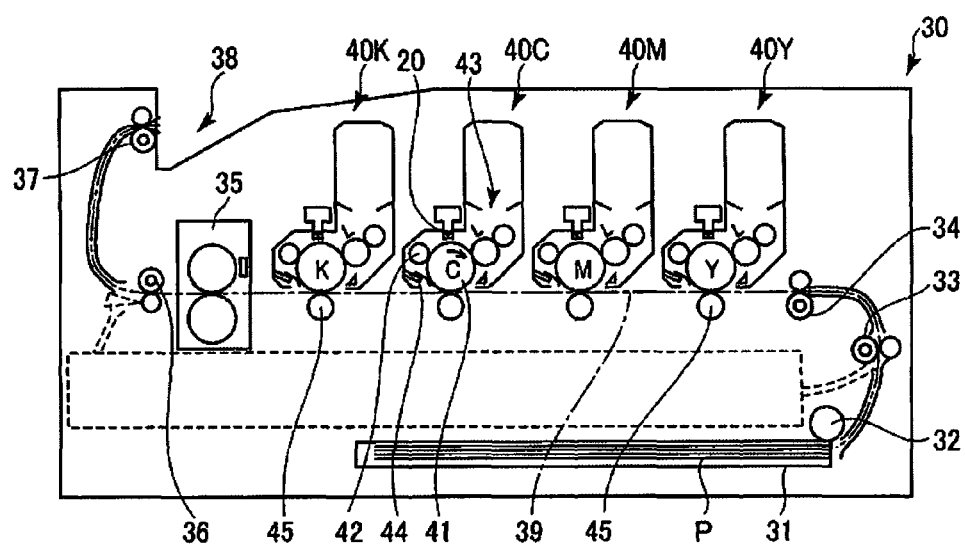
FIG. 13 is a diagram showing a configuration of an image formation apparatus using the print head in FIG. 12.

FIG. 13 is a diagram showing a configuration example of image formation apparatus 30 using print head 20 shown in FIG. 12.

Image formation apparatus 30 is a color electrophotographic printer, for example, and includes process units 40Y, 40M, 40C, 40K configured to form images of yellow, magenta, cyan and black. Process units 40Y, 40M, 40C, 40K are disposed along conveyance path 39 of media P such as print sheets. Since process units 40Y, 40M, 40C, 40K have a common configuration, a configuration of process unit 40C of cyan is taken as an example and described.

Process unit 40C includes photosensitive drum 41 serving as an image carrier rotatable in a clockwise direction in the drawing. Charge device 42, print head (exposure device) 20, development device 43, and cleaning device 44 are disposed around photosensitive drum 41 in a rotation direction thereof. Charge device 42 is configured to uniformly charge a surface of photosensitive drum 41. Print head (exposure device) 20 is configured to form an electrostatic latent image by selectively applying light to the surface of photosensitive drum 41. Development device 43 is configured to develop the electrostatic latent image formed on the surface of photosensitive drum 41, by using a toner of a predetermined color (cyan). Cleaning device 44 is configured to remove the toner remaining on the surface of photosensitive drum 41.

Media cassette 31 configured to house media P is installed in a lower part of image formation apparatus 30. Feed roller 32 is disposed above media cassette 31 and is configured to separately feed media P, one by one, housed in media cassette 31. Moreover, paired conveyance rollers 33, 34 configured to convey each medium P to process units 40Y, 40M, 40C, 90K are disposed in a conveyance direction of medium P fed by feed roller 32.

Transfer roller 45 is disposed at a position opposed to each photosensitive drum 41 of process units 40Y, 40M, 40C, 40K. In order to transfer a toner image on photosensitive drum 41 to medium P, a predetermined potential difference is provided between a surface of photosensitive drum 41 and a surface of transfer roller 45.

Fixation device 35 is disposed on a downstream side of process units 40Y, 40M, 40C, 40K along conveyance path 39. Fixation device 35 includes a heat roller and a back-up roller, and is configured to fix the toner transferred onto medium P by pressure and heating. In addition, paired delivery rollers 36, 37 configured to convey medium P delivered from fixation device 35 to stacker portion 38 provided outside image formation apparatus 30 are disposed on a downstream side of fixation device 35.

Next, operations of image formation apparatus 30 are described. First, media P housed in media cassette 31 are separately fed, one by one, to conveyance path 39 by feed roller 32. Each medium P fed to conveyance path 39 is conveyed to a nip portion between transfer roller 45 and photosensitive drum 41 of process unit 40Y by paired conveyance rollers 33, 34.

In process unit 40Y, a surface of photosensitive drum 41 is uniformly charged by charge device 42. Moreover, each thin-film semiconductor light emission element 101 (FIG. 12) of print head 20 emits light in accordance with image information. Thereby, the surface of photosensitive drum 41 is exposed to light, and thus an electrostatic latent image is formed. The electrostatic latent image formed on photosensitive drum 41 is developed by development device 43 to be a toner image. When medium P passes through a nip between photosensitive drum 41 and transfer roller 45, the toner image on the surface of photosensitive drum 41 is transferred to medium P.

Medium P passes through process units 40M, 40C, 40K in the same manner as described above, and the toner image on each photosensitive drum 41 is sequentially transferred to the surface of medium P.

Medium P to which the toner images are transferred is conveyed to fixation device 35, and the toner images are fixed to medium P by heat and pressure. Medium P to which the toner images are fixed is delivered to stacker portion 38 by paired delivery rollers 36, 37. Thereby, a color image is formed on medium P.

Note that it is needless to say that a semiconductor light emission device of the above-described embodiments can be employed in an image formation apparatus other than the above-described color electrophotographic printer.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A semiconductor light emission device, comprising:
   a substrate; and
   semiconductor light emission elements mounted on the substrate, each semiconductor light emission element including an anode connection pad and a cathode connection pad,
   wherein one of the anode connection pad and the cathode connection pad has a fine shaped portion, and
   wherein the anode connection pad and the cathode connection pad are formed above a single layer, with a first interlayer dielectric film interposed between the anode connection pad and the single layer, and without the first interlayer dielectric film interposed between the cathode connection pad and the single layer.

2. The semiconductor light emission device according to claim 1, further comprising an anode common wiring and a cathode common wiring provided above the substrate, wherein
   the anode connection pads of the semiconductor light emission elements are electrically connected with the anode common wiring by a first thin-film wiring, and
   the cathode connection pads of the semiconductor light emission elements are electrically connected with the cathode common wiring by a second thin-film wiring.

3. The semiconductor light emission device according to claim 1, wherein
   the fine shaped portion is formed to have one from the group of a mesh shape, a striped pattern, a diffraction pattern and a spiral shape.

4. The semiconductor light emission device according to claim 1, wherein
   the one of the anode connection pad and the cathode connection pad is formed of a film deposited by metal vapor deposition or sputtering, and patterned by etching or lift-off.

5. The semiconductor light emission device according to claim 1, wherein
   the semiconductor light emission element is a thin film.

6. The semiconductor light emission device according to claim 1, wherein
   the semiconductor light emission element is fixed to the substrate by an intermolecular force.

7. The semiconductor light emission device according to claim 2, wherein
   the first thin-film wiring and the second thin-film wiring are each in a rectangular shape.

8. The semiconductor light emission device according to claim 1, wherein
   the first interlayer dielectric film is made of one of an inorganic dielectric film and an organic dielectric film.

9. The semiconductor light emission device according to claim 1, wherein
   the fine shaped portion is processed to be finer than a connection portion connecting the fine shaped portion and the semiconductor light emission element with each other.

10. The semiconductor light emission device according to claim 1, wherein
    the fine shaped portion formed in the one of the anode connection pad and the cathode connection pad comprises openings through which a front surface and a back surface of the one pad communicate with each other.

11. The semiconductor light emission device according to claim 10, wherein
    each of the openings is in a slit shape opened to a side surface of the one pad.

12. The semiconductor light emission device according to claim 10, wherein
    each of the openings of the fine shaped portion is smaller than an opening for a connection portion connecting the fine shaped portion and the semiconductor light emission element with each other.

13. An image display apparatus, comprising the semiconductor light emission device according to claim 1.

* * * * *